(12) United States Patent
Huang

(10) Patent No.: US 8,283,586 B2
(45) Date of Patent: Oct. 9, 2012

(54) CIRCUIT BOARD SENSING MODULE

(76) Inventor: Kuo-An Huang, Taipei (TW)

( * ) Notice: Subject to any disclaimer, the term of this patent is extended or adjusted under 35 U.S.C. 154(b) by 643 days.

(21) Appl. No.: 12/493,303

(22) Filed: Jun. 29, 2009

(65) Prior Publication Data

US 2009/0321230 A1    Dec. 31, 2009

(30) Foreign Application Priority Data

Jun. 30, 2008 (TW) .............................. 97124480 A

(51) Int. Cl.
*H01H 35/00* (2006.01)
(52) U.S. Cl. .................. 200/61; 200/61.45 R; 200/61.52
(58) Field of Classification Search ...................... 200/61
See application file for complete search history.

(56) References Cited

U.S. PATENT DOCUMENTS 5,987,988 A * 11/1999 Kunimi et al. ............. 73/514.01
2008/0037075 A1 * 2/2008 Masuda ........................ 358/482

* cited by examiner

*Primary Examiner* — Renee Luebke
*Assistant Examiner* — Lheiren Mae Caroc
(74) *Attorney, Agent, or Firm* — WPAT, PC; Justin King

(57) ABSTRACT

The present invention discloses a circuit board sensing module comprising a plurality of circuit boards and a sphere. The circuit boards form a hollow polyhedron with multiple surfaces and included angles. When the sphere is in any of the included angles, a circuit board is controlled to be electrically conducting, and the other circuit boards are open circuits in the meantime. Besides, the present invention further discloses a multi-surface operation apparatus comprising the circuit board sensing module. It comprises a plurality of control interfaces and at least a circuit board sensing module. When any of the control interfaces is operated, the circuit board sensing module enables the switch of the selected control interface, and shuts down the switches of the other switches.

13 Claims, 9 Drawing Sheets

CIRCUIT BOARD SENSING MODULE

BACKGROUND OF THE INVENTION

1. Field of the Invention

The present invention relates to a sensing module, more particularly to a circuit board sensing module.

2. Description of the Prior Art

With the progressing of the times, most of the electric appliances gradually adopt the remote wireless control technologies in general (such as air condition, video-audio device, communication device, and so on). Besides, people in the modern society pay attention to the quality of life so that almost every family is configured with many kinds of video-audio devices (such as television, stereo, video recorder, DVD, and lighting device). The application of the remote control technologies makes the operation of the electric appliances very convenient for consumers, but there are still some drawbacks. For example, every controlled device needs an independent remote controller. But facing the situation that there are many video-audio devices, consumers have to deal with many remote controllers with different specifications. Besides there is a problem for increasing the storage spaces and operating inconveniently, it often happens that the remote controller is operated by the consumer for the wrong device so that the device cannot be controlled due to the similar appearances for the different kinds of remote controllers. For resolving the problem mentioned above, there is a "universal controller" in the market for the purpose of operating all the remote controlled electric appliances by single remote controller. There is no doubt that it is intended to work for well thought, but it is still insufficient for convenience and practicality.

In general, for the reason to satisfy the various functions of the different electric appliances, the universal remote controller needs to provide the non-common function keys besides the basic buttons. Therefore, there are various buttons over the remote controller. Because the common buttons are too numerous and trivial, it often causes the consumer to press the wrong button so as to produce the inaccurate action or signal.

For the purposes of the good appearance and ergonomics, the different kinds of buttons can be configured in different surfaces according to their functions. Every surface is a independent operation interface. Every operation interface of the corresponding surface can be the remote interface of the electric appliance (TV remote controller, air conditioner remote controller, electric fan remote controller, video-audio remote controller), telephone dialing interface, video-audio playing interface of multimedia, control interface of electric lock of a house door or car door, touch screen interface, toy game stick, lighting control interface, auto-control interface, graphics operation interface, computer operation interface, mouse control interface, keyboard operation interface, surveillance control interface, temperature sensing interface, pressure sensing and operation interface, tact switch interface, speed sensing interface, balance sensing interface, opto-sensor interface, moisture sensing interface, monitor displaying interface, auto-spin operation interface, window and door operation interface, positioning operation interface, distance-measurement operation interface, voice-control operation interface, monitoring interface, magnetic-control operation interface, power coil operation interface, banner operation interface, and projection operation interface. Besides, the buttons locate in the different surfaces, it is very likely to mis-press the button and cause inaccurate result when operating.

Accordingly, it is desired to develop a circuit board sensing module applied for multiple surfaces to resolve the problem to carelessly press the button and simplify the connecting circuits of the polyhedron. It can accomplish that the independent buttons over the multiple control panels can be operated arbitrarily without the chance to mis-press the button or interfere each other. It can also increase the convenience and practicality of operation and the utility of the industry.

SUMMARY OF THE INVENTION

With respect to the background of the invention, the present invention provides a circuit board sensing module for the requirement of the industry.

An object of the present invention is to establish a multi-surface operation apparatus according to the circuit board sensing module. It is intended to provide individually independent control interface for the different surfaces. The control interfaces do not share buttons and perform their own functions. It can allow the users to operate and use more easily.

Another object of the present invention is to simplify the connecting circuits of the multi-surface operation apparatus by connecting a plurality of the circuit board sensing module.

Another object of the present invention is to resolve the problem that there are inaccurate signals due to mis-press the button of the other interface when operating arbitrarily on the control interfaces by adopting the circuit board sensing module.

According to the objects mentioned above, the present invention discloses a circuit discloses a circuit board sensing module comprising a plurality of circuit boards and a sphere. The circuit boards form a hollow polyhedron with multiple surfaces and included angles. When the sphere is in any of the included angles, a circuit board is controlled to be electrically conducting, and the other circuit boards are open circuits in the meantime.

Besides, the mentioned circuit board sensing modules are connected to operate so as to reduce the number of the connecting circuits between the operation objects and the microprocessor.

DESCRIPTION OF THE PREFERRED EMBODIMENTS

What is probed into the invention is a circuit board sensing module. Detail descriptions of the structure and elements will be provided as followed in order to make the invention thoroughly understood. The application of the invention is not confined to specific details familiar to those who are skilled in the art. On the other hand, the common structures and elements that are known to everyone are not described in details to avoid unnecessary limits of the invention. Some preferred embodiments of the present invention will now be described in greater detail as followed. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

Figure 1:
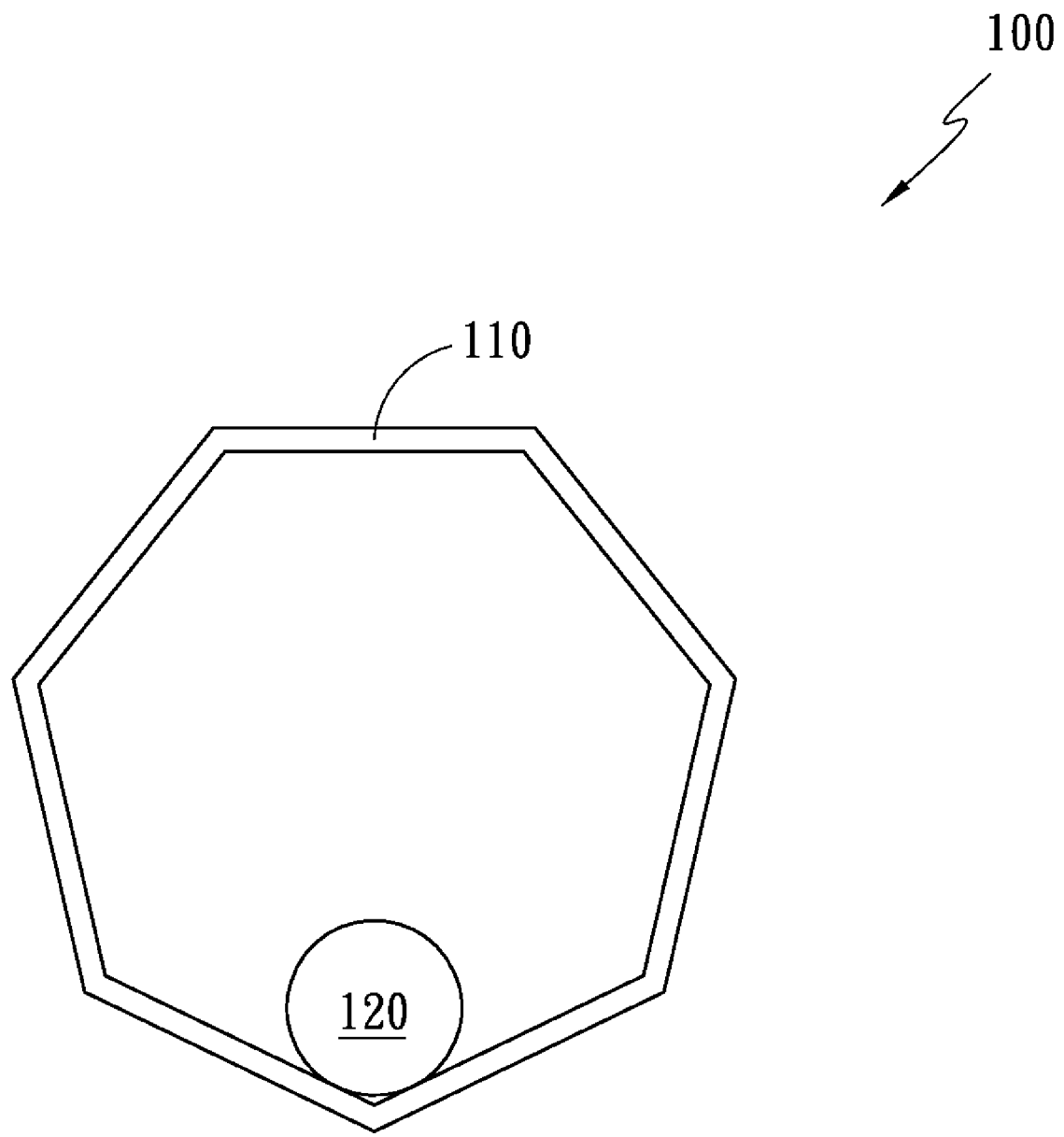
FIG. 1 is the diagram of the circuit board sensing module according to the first embodiment of the present invention.

Referring to FIG. 1, the first embodiment of the present invention discloses a circuit board sensing module 100, comprising a plurality of circuit boards 110 and a sphere 120. The circuit boards 110 mentioned above form a hollow polyhedron with a plurality of surfaces and included angles. When the sphere 120 is in any of the included angles, a specific circuit board is controlled to be electrically conducting, and other circuit boards are open circuits in the meantime. Each of the circuit boards mentioned above comprises at least two sensing devices. When the sphere 120 is in any of the included angle formed by two circuit boards and contacts with the sensing devices of the two circuit boards in the meantime, a specific circuit board can be caused to be electrically conducting and the other circuit boards are open circuits. The circuit boards sensing module 100 mentioned above can be connected to operate.

Figure 2A:
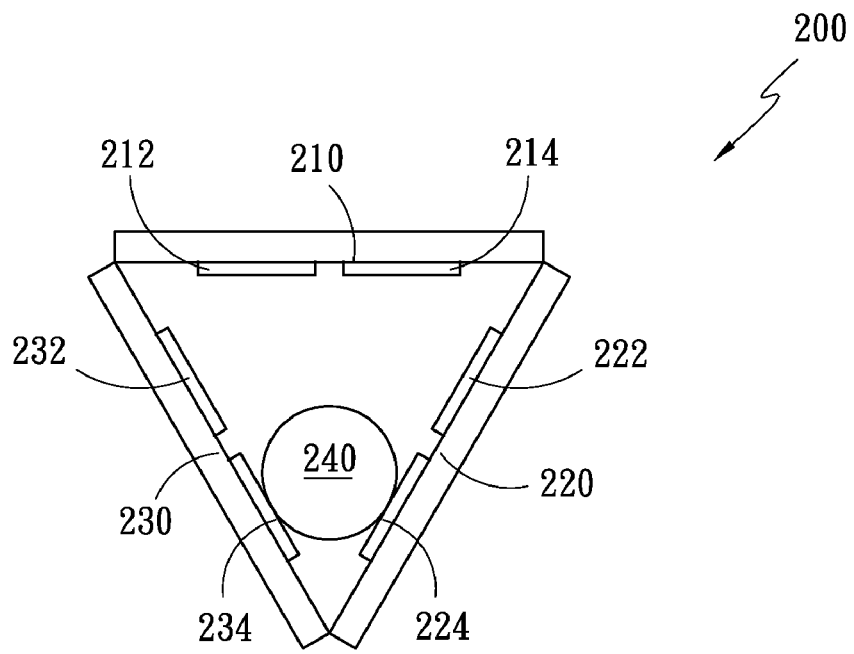
FIGS. 2A, 2B, and 2C are the diagrams of the circuit board sensing module according to the second embodiment of the present invention.

Referring to FIG. 2A, the second embodiment of the present invention discloses a circuit board sensing module 200, comprising three circuit boards and a sphere 240. The three circuit boards are the first circuit board 210, the second circuit board 220, and the third circuit board 230. The here circuit boards form a hollow trihedron. The first circuit board 210 and the second circuit board 220 form the first included angle. The second circuit board 220 and the third circuit board 230 form the second included angle. The third circuit board 230 and the first circuit board 210 form the third included angle.

The sphere 240 enables the third circuit board 230 to be electrically conducting when the sphere is in the first included angle and contacts with the internal side of the first circuit 210 board and the internal side of the second circuit board 220, enables the first circuit board 210 electrically conducting when the sphere 240 is in the second included angle and contacts with the internal side of the second circuit board 220 and the internal side of the third circuit board 230, and enables the second circuit board 220 electrically conducting when the sphere 240 is in the third included angle and contacts with the internal side of the third circuit board 230 and an internal side of the first circuit board 210.

Figure 2B:
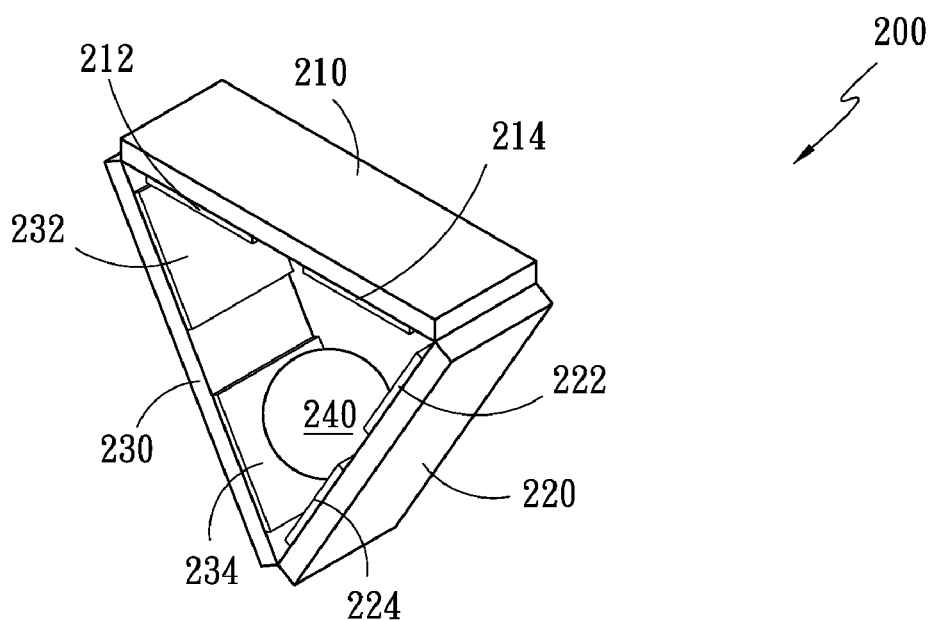

Referring to FIG. 2B, in the embodiment, each of the circuit boards comprises at least two sensing devices. The first circuit board 210 comprises two sensing devices 212, 214. The second circuit board 220 comprises two sensing deices 222, 224. The third circuit board 230 comprises two sensing devices 232, 234.

Figure 2C:
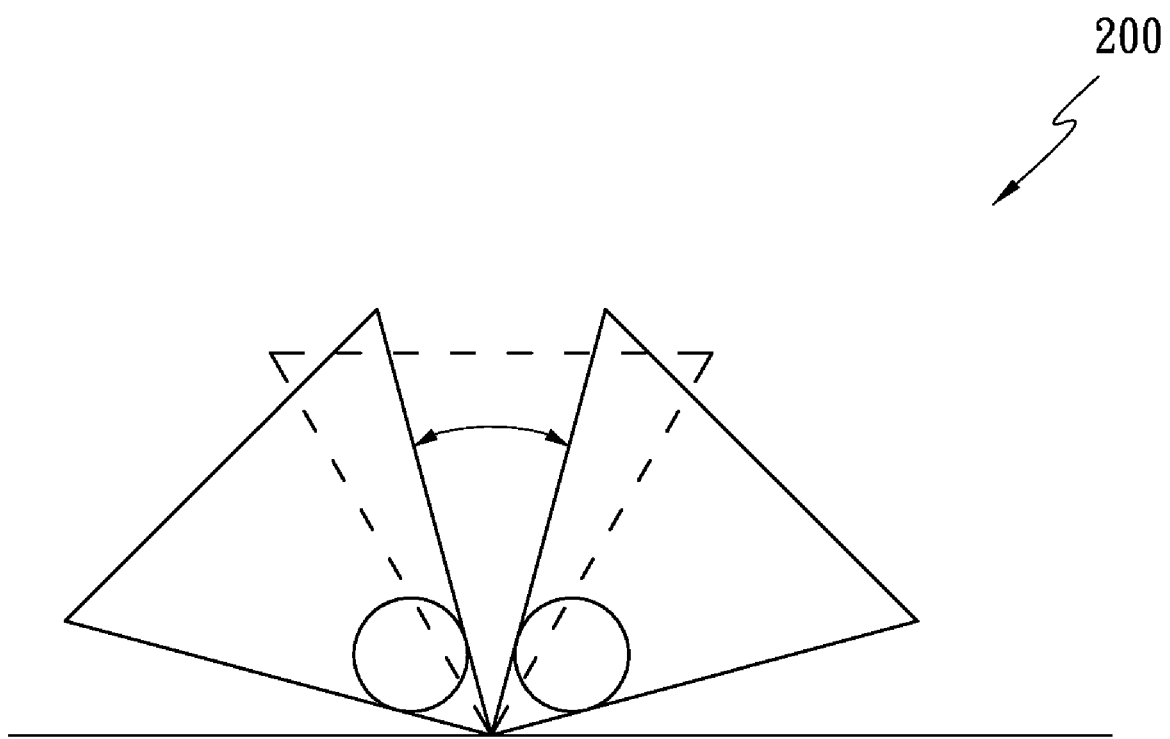

Referring to FIG. 2C, the embodiment discloses a circuit board sensing module applied to the remote control telecom apparatus. Many of the current remote control devices integrate a plurality of functions into a remote control device. For example, the remote controller of the electric appliance, telephone dialing buttons, and multimedia function keys are integrated into a remote control device. To distinguish the functions, the similar function keys are configured in the same surface of the panel. Taking the figure as the example, when we try to press the button in the top, it is very likely to press the buttons in the both sides to cause the circuit to work inaccurately. Therefore, the circuit board sensing module of the embodiment can resolve the problem mentioned above. The position of the sphere is affected by the gravity. The sphere falls to the included angle in the down side to enable the panel in the up side. Besides, it is possible to shake the remote controller when holding by hand. The tolerate degree for shaking toward the right or left is very large according to the figure. The misjudgment should not happen.

Figure 3:
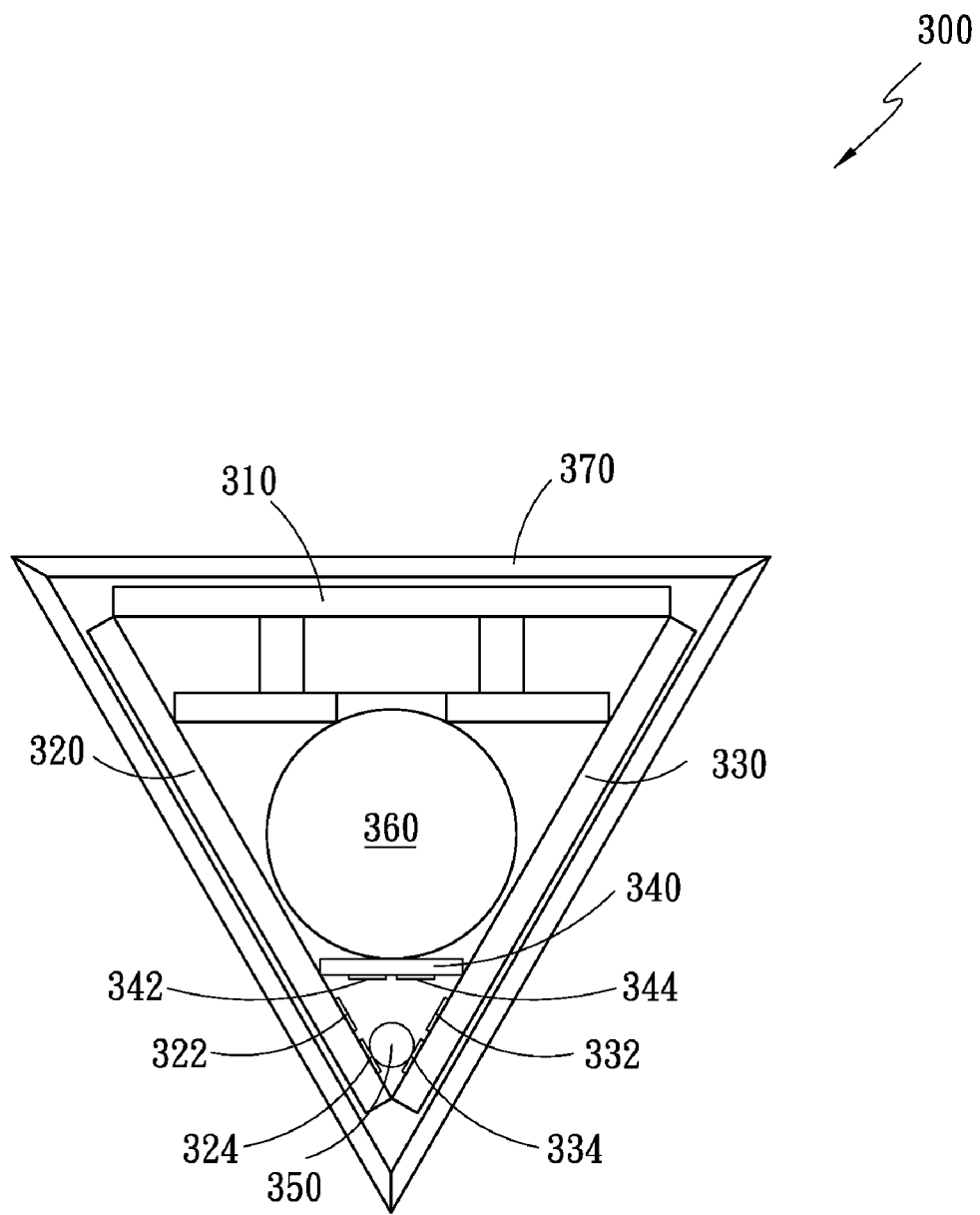
FIG. 3 is the diagram of the circuit board sensing module according to the third embodiment of the present invention.

Referring to FIG. 3, the third embodiment of the present invention discloses a circuit board sensing module 300, comprising four circuit boards and a sphere 350. The four circuit boards are the fourth circuit board 310, the fifth circuit board 320, the sixth circuit board 330, and the seventh circuit board 340. The fourth circuit board 310, the fifth circuit board 320, the sixth circuit board 330, and the seventh circuit board 340 form a hollow trihedron. The seventh circuit board 340 is parallel to the fourth circuit board 310 and bridges between the internal side of the fifth circuit board 320 and the internal side of the sixth circuit board 330. The fifth circuit board 320 and the seventh circuit board 340 form the fourth included angle, the fifth circuit board 320 and the sixth circuit board 330 form the fifth included angle, and the sixth circuit board 330 and the seventh circuit board 340 form the sixth included angle.

The sphere 350 enables the sixth circuit board 330 to be electrically conducting when the sphere 350 is in the fourth included angle and contacts with the internal side of the fifth circuit board 320 and the internal side of the seventh circuit board 340, enables the fourth circuit board 310 to be electrically conducting when the sphere 350 is in the fifth included angle and contacts with the internal side of the sixth circuit board 330 and the internal side of the fifth circuit board 320, and enables the fifth circuit board 320 to be electrically conducting when the sphere 350 is in the sixth included angle and contacts with the internal side of the sixth circuit board 330 and the internal side of the seventh circuit board 340. The circuit board sensing module 300 motioned above can be connected to operated.

Each of the circuit boards comprises at least two sensing devices. The fifth circuit board 320 comprises two sensing devices 322, 324. The sixth circuit board 330 comprises two sensing deices 3322, 334. The seventh circuit board 340 comprises two sensing devices 342, 344.

The circuit board sensing module 300 disclosed by the embodiment further comprises a battery socket. The battery socket is in the hollow trihedron formed by the fourth circuit board 310, the fifth circuit board 320, and the sixth circuit board 330. The structure of the battery socket can be a space formed by the seventh circuit board 240 and the groove formed by two circuit boards. The space is used for accommodating the battery 360. Besides, the circuit board sensing module 300 can further comprise at least a control interface 370. The control interface is in the external sides of the fourth circuit board 310, the fifth circuit board 320, and the sixth circuit board 330.

Figure 4:
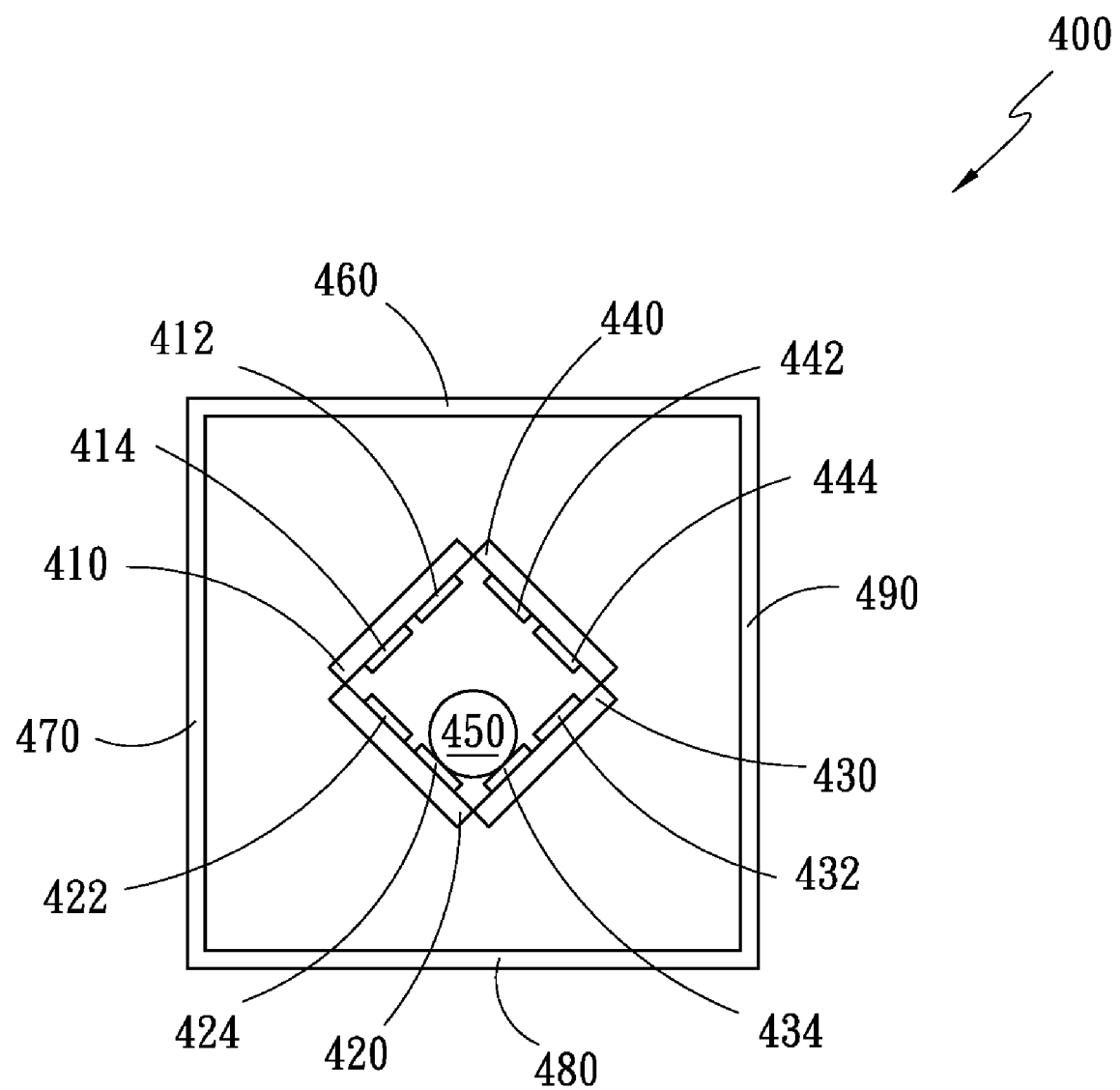
FIG. 4 is the diagram of the circuit board sensing module according to the fourth embodiment of the present invention.

Referring to FIG. 4, the fourth embodiment of the present invention discloses a circuit board sensing module 400, comprising four circuit boards, four control circuit boards, and a sphere. The four circuit boards are the eighth circuit board 410, the ninth circuit board 420, the tenth circuit board 430, and the eleventh circuit board 440, and form a hollow tetrahedron. For the four control circuit boards, any two control circuit boards which face each other are parallel to each other. The eleventh included angle points to the first control circuit board 460, the eighth included angle points to the second control circuit board 470, the ninth included angle points to the third control circuit board 480, and the tenth included angle points to the fourth control circuit board 490. The connecting line of the eleventh included angle and ninth included angle is perpendicular to the first control circuit board 460 and the third control circuit board 480 respectively, and a connecting line of the eighth include angle and the tenth included angle is perpendicular to the second control circuit board 470 and the fourth control circuit board 490.

The sphere 450 enables the first control circuit board 460 to be electrically conducting when the sphere 450 is in the ninth included angle and contacts with the internal side of the ninth circuit board 420 and the internal side of the tenth circuit board 430, enables the second control circuit board 470 to be electrically conducting when the sphere 450 is in the tenth included angle and contacts with the internal side of the eleventh circuit board 440 and the internal side of the tenth circuit board 430, enables the third control circuit board 480 to be electrically conducting when the sphere 450 is in the eleventh included angle and contacts with the internal side of the eleventh circuit board 440 and the internal side of the eighth circuit board 470, and enables the fourth control circuit board 490 to be electrically conducting when the sphere 450 is in the eighth included angle and contacts with the internal side of the eighth circuit board 410 and the internal side of the ninth circuit board 420. The circuit board sensing module 400 mentioned above can be connected to be operated.

Each of the circuit boards comprises at least two sensing devices. The seventh circuit board 410 comprises two sensing devices 412, 414. The eighth circuit board 420 comprises two sensing deices 422, 424. The ninth circuit board 430 comprises two sensing devices 432, 434. The tenth circuit board comprises two sensing devices 442, 444.

Figure 5:
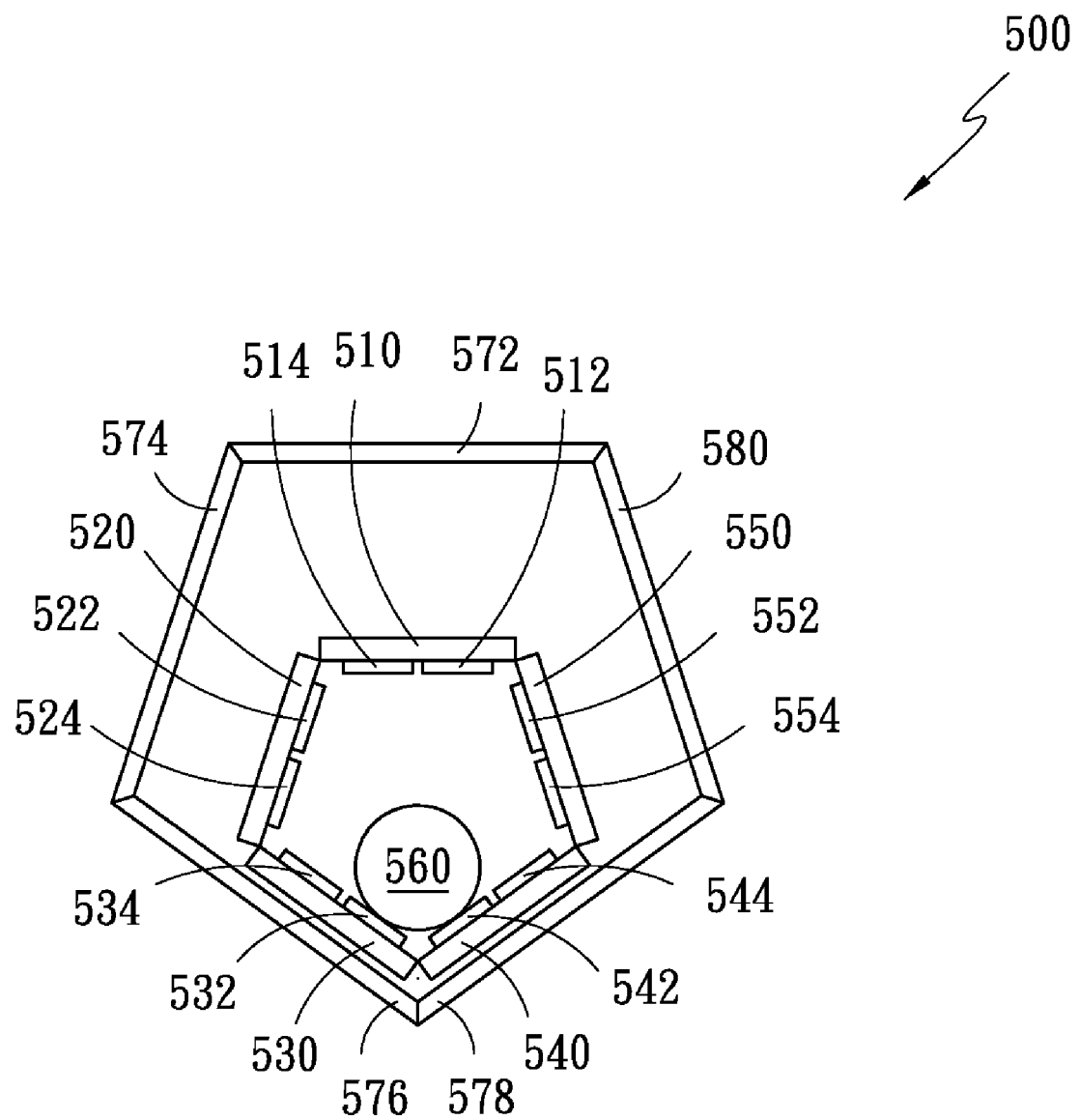
FIG. 5 is the diagram of the circuit board sensing module according to the fifth embodiment of the present invention.

Referring to FIG. 5, the fifth embodiment of the present invention discloses a circuit board sensing module 500, comprising five circuit boards, five control circuit boards, and a sphere. The five circuit boards are the twelfth circuit board 510, the thirteen circuit board 520, the fourteen circuit board 530, and the fifteenth circuit board 540, and form a hollow pentahedron. The twelfth circuit board 510 and the thirteenth circuit board 520 form a twelfth included angle, the thirteen circuit board 520 and the fourteenth circuit board 530 form a thirteenth included angle, the fourteenth circuit board 530 and the fifteenth circuit board 540 form a fourteenth included angle, the fifteenth circuit board 540 and the sixteenth circuit board 550 form a fifteenth included angle, and sixteenth circuit 550 board and the twelfth circuit board 510 form a sixteenth included angle. Five control circuit boards comprise the fifth control circuit board 572, the sixth control circuit board 574, the seventh control circuit board 576, the eighth control circuit board 578, and the ninth control circuit board 580, and encompass external sides of the five circuit boards to form a hollow pentahedron.

The sphere 560 enables the fifth control circuit board 578 to be electrically conducting when the sphere 560 is in the twelfth included and contacts with the internal side of the twelfth circuit board 510 and the internal side of the thirteenth circuit board 520, enables the sixth control circuit board 580 to be electrically conducting when the sphere 560 is in the thirteenth included and contacts with the internal side of the thirteenth circuit board 520 and the internal side of the fourteenth circuit board 530, enables the seventh control circuit board 572 to be electrically conducting when the sphere 560 is in the fourteenth included and contacts with the internal side of the fourteenth circuit board 530 and the internal side of the fifteenth circuit board 540, enables the eighth control circuit board 574 to be electrically conducting when the sphere 560 is in the fifteenth included and contacts with the internal side of the fifteenth circuit board 540 and the internal side of the sixteenth circuit board 550, and enables the ninth control circuit board 576 to be electrically conducting when the sphere 560 is in the sixteenth included and contacts with the internal side of the sixteenth circuit board 550 and the internal side of the twelfth circuit board 510. The circuit board sensing module 500 mentioned above can be connected to be operated.

Each of the circuit boards mentioned above comprises at least two sensing devices. The eleventh circuit board 510 comprises two sensing devices 512, 514. The twelfth circuit board 520 comprises two sensing devices 522, 524. The thirteenth circuit board 530 comprises two sensing devices 532, 534. The fourteenth circuit board 540 comprises two sensing devices 542, 544. The fifteenth circuit board 550 comprises two sensing devices 552, 554.

The sixth embodiment of the present invention discloses a multi-surface operation apparatus comprising a circuit board sensing module. It comprises a plurality of control interfaces and at least a circuit board sensing module. The control interfaces form a polyhedron. Each surface of the polyhedron comprises independent control buttons. The sensing module is configured inside the open-circuit polyhedron. When an open-circuit control interface is operated, the open-circuit circuit board sensing module enables the switch of the selected control interface, and shuts down the other open-circuit operation interfaces in the meantime. The control interfaces mentioned above are selected from the following or their combination: remote control interface of electric appliance, telephone dialing interface, video-audio playing interface of multimedia, control interface of electric lock of a house door or car door, touch screen interface, toy game stick, lighting control interface, auto-control interface, graphics operation interface, computer operation interface, mouse control interface, keyboard operation interface, surveillance control interface, temperature sensing interface, pressure sensing and operation interface, tact switch interface, speed sensing interface, balance sensing interface, opto-sensor interface, moisture sensing interface, monitor displaying interface, auto-spin operation interface, window and door operation interface, positioning operation interface, distance-measurement operation interface, voice-control operation interface, monitoring interface, magnetic-control operation interface, power coil operation interface, banner operation interface, and projection operation interface.

Figure 6A:
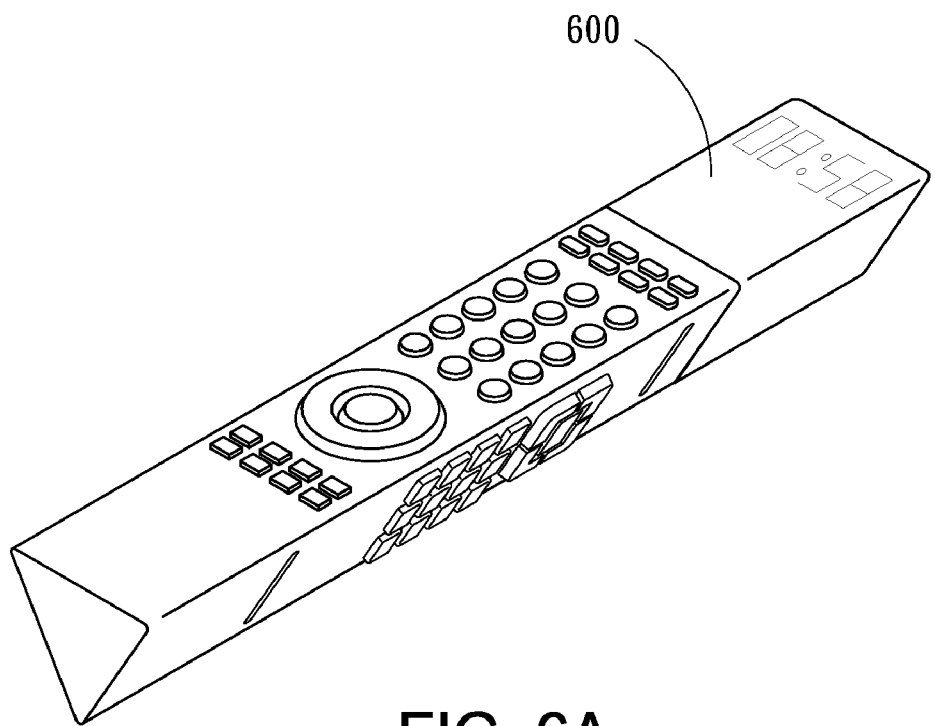
FIGS. 6A, 6B, 6C, and 6D are the tri-surface operation device according to the sixth embodiment of the present invention.
Figure 6B:
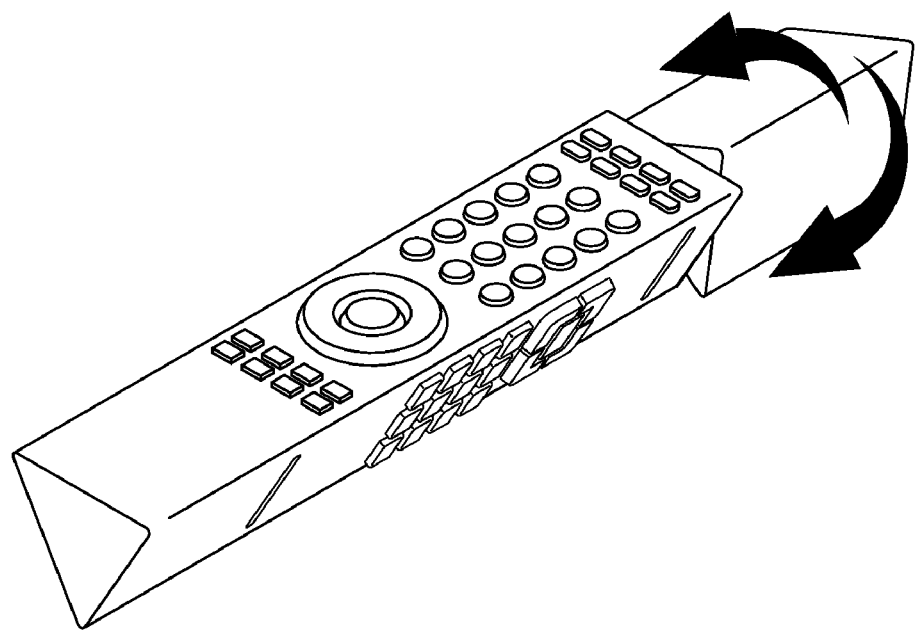
Figure 6C:
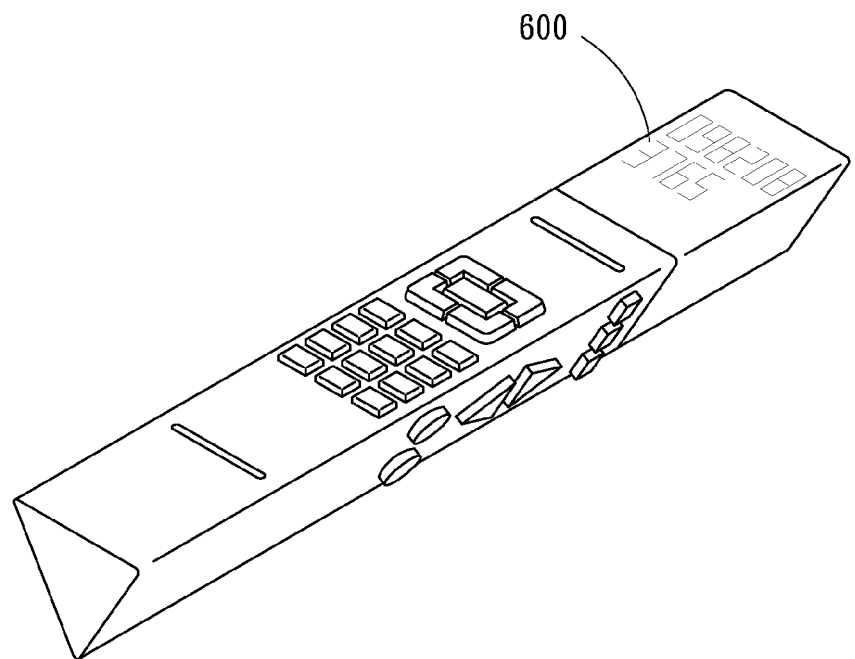
Figure 6D:
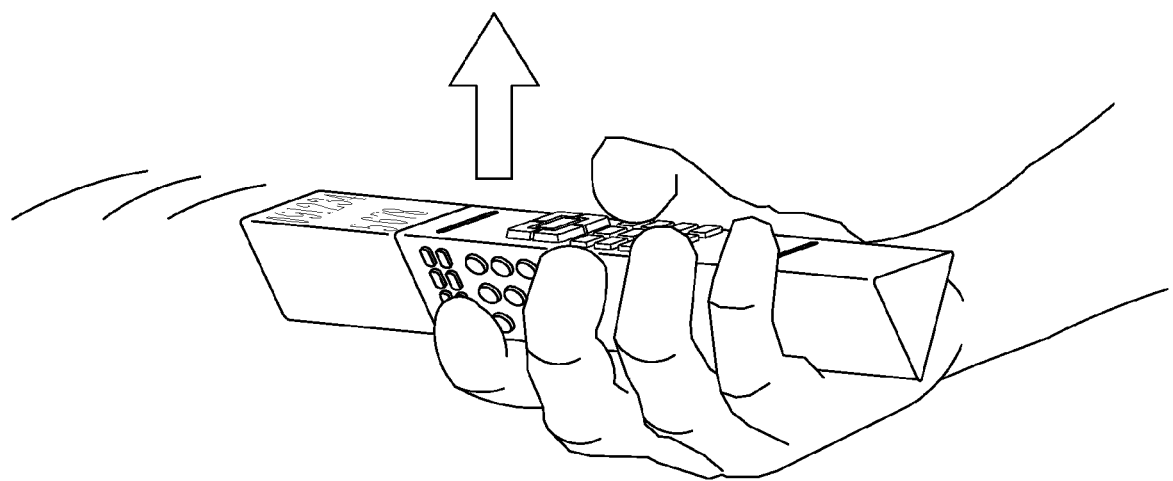

Referring to FIGS. 6A, B, C, and D, they are the embodiments of the examples mentioned above. The circuit board sensing module is applied for the tri-surface operation device. It can integrate the electric appliance remote control, telephone dialing buttons, and multimedia function keys into a single device, and the arrangement of the panels is configured according to their different characteristics. This kind of design can achieve the best functionality in a smallest space, accomplish the ergonomics, and provide the remote controller with the best economic result. Besides, the tri-surface operation device comprises a rotatable screen 600. It can rotate toward the right or left up to 120 degrees, and switch the screens by the circuit board sensing module. The screen can be a telephone display, clock, multimedia display device, and so on. This design can achieve various combinations to provide more idea and industry utility for a remote controller.

Figure 7:
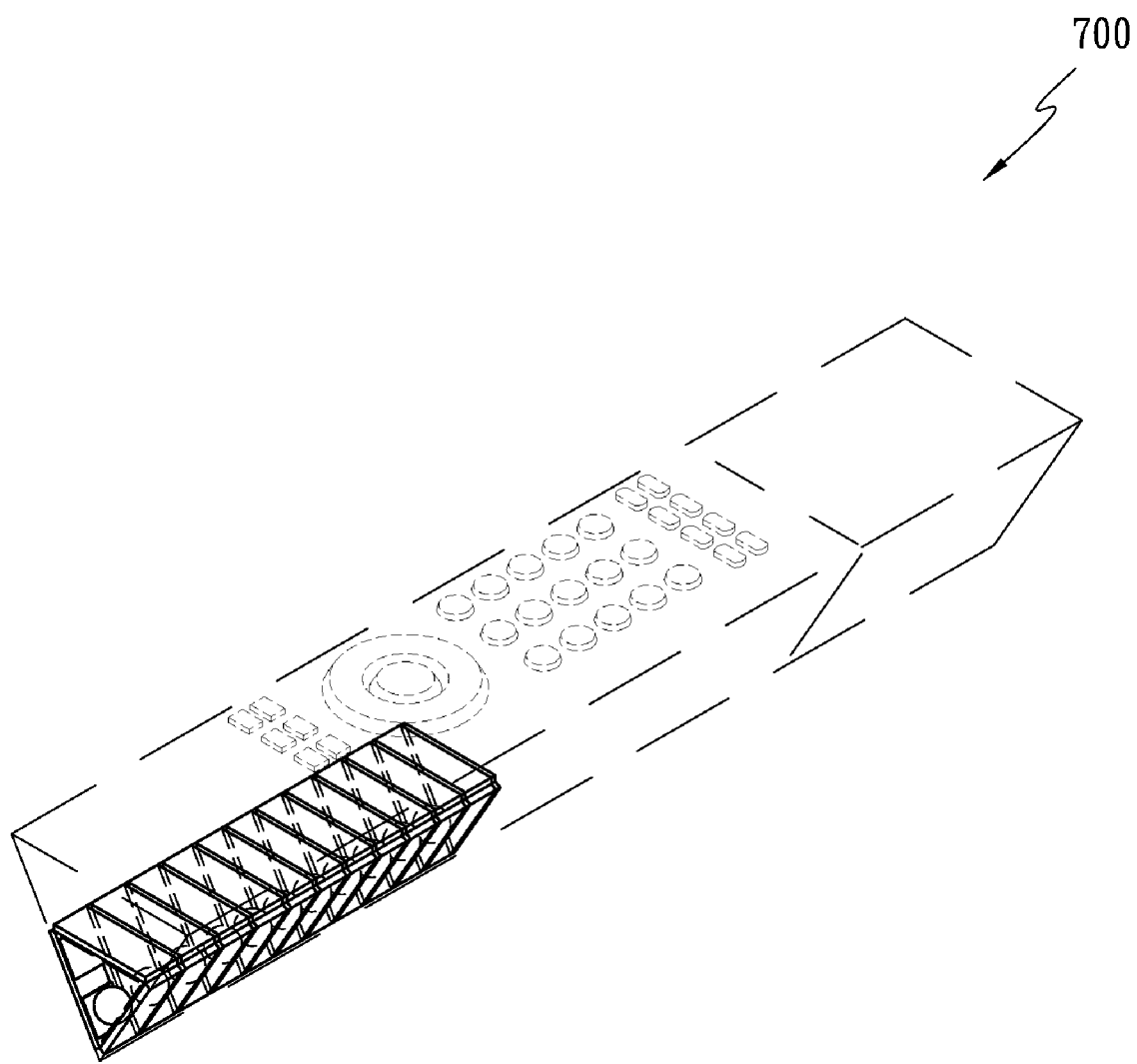
FIG. 7 is the diagram of the circuit board sensing module according to the present invention.

Referring to FIG. 7, it is the tri-surface operation device 700 comprising the circuit board sensing module. The circuit board sensing module can be connected to work. There is a shield between the adjacent sensing modules. It makes the sensing modules look like a small triangle box. For example, 24 buttons in an operation surface need 3×8 scanning lines, i.e. 11 wires. Therefore, three surfaces need 33 wires. But if 11 circuit board sensing modules of the present invention are adopted, it only needs 11 wires connected to the microprocessor from the circuit board sensing modules in parallel. It can save up to 22 wires. And every circuit board sensing module adopts mechanical contact conducting method without the need of power supply. It is more efficient to reduce power consumption. Besides, the 11 circuit board sensing modules are not limited to be arranged in the same included angle. They can be distributed over the three included angles.

Other modifications and variations are possibly developed in light of the above demonstrations. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A circuit board sensing module, comprising:
   a plurality of circuit boards forming a hollow polyhedron, wherein the polyhedron comprises a plurality of surfaces and a plurality of included angles; and
   a sphere enabling a selected circuit board of the circuit boards to be electrically conducting and the other circuit boards to be disabled when the sphere is in a selected included angle of the included angles;
   wherein any of the circuit boards comprises at least two sensing devices.

2. The circuit board sensing module according to claim 1, wherein the circuit board sensing module further comprises:
   three circuit boards comprising a first circuit board, a second circuit board, and a third circuit board, and forming a hollow trihedron, wherein the first circuit board and the second circuit board form a first included angle, the second circuit board and the third circuit board form a second included angle, and the third circuit board and the first circuit board form a third included angle; and
   a sphere enabling the third circuit board to be electrically conducting when the sphere is in the first included angle and contacts with an internal side of the first circuit board and an internal side of the second circuit board, enabling the first circuit board to be electrically conducting when the sphere is in the second included angle and contacts with an internal side of the second circuit board and an internal side of the third circuit board, and enabling the second circuit board to be electrically conducting when the sphere is in the third included angle and contacts with an internal side of the third circuit board and an internal side of the first circuit board.

3. The circuit board sensing module according to claim 2, wherein each of the first, second, and third circuit boards comprises at least two sensing devices.

4. The circuit board sensing module according to claim 1, wherein the circuit board sensing module further comprises:
   four circuit boards comprising a fourth circuit board, a fifth circuit board, a sixth circuit board, and a seventh circuit board, to form a hollow trihedron, wherein the seventh circuit board is parallel to the fourth circuit board and bridges between an internal side of the fifth circuit board and an internal side of the sixth circuit board, the fifth circuit board and the seventh circuit board form a fourth included angle, the fifth circuit board and the sixth circuit board form a fifth included angle, and the sixth circuit board and the seventh circuit board form a sixth included angle; and
   a sphere enabling the sixth circuit board to be electrically conducting when the sphere is in the fourth included angle and contacts with an internal side of the fifth circuit board and an internal side of the seventh circuit board, enabling the fourth circuit board to be electrically conducting when the sphere is in the fifth included angle and contacts with an internal side of the sixth circuit board and an internal side of the seventh circuit board, and enabling the fifth circuit board to be electrically conducting when the sphere is in the sixth included angle and contacts with an internal side of the sixth circuit board and an internal side of the seventh circuit board.

5. The circuit board sensing module according to claim 4, wherein each of the fifth circuit board, the sixth circuit board, and the seventh circuit board further comprise at least two sensing devices.

6. The circuit board sensing module according to claim 1, wherein the circuit board sensing module further comprises:
   an eighth circuit board;
   a ninth circuit board;
   a tenth circuit board;
   an eleventh circuit board, wherein said eighth circuit board, said ninth circuit board, said tenth circuit board, and said eleventh circuit board form a hollow tetrahedron, and each of two pairs of these four circuit boards being parallel to each other, wherein the eighth circuit board and the ninth circuit board form an eighth included angle, the ninth circuit board and the tenth circuit board form a ninth included angle, the ten circuit board and the eleventh circuit board form a tenth included angle, and the eleventh circuit board and the eighth circuit board form an eleventh included angle;
   a first control circuit board;
   a second control circuit board;
   a third control circuit board;
   a fourth control circuit board, wherein any two control circuit boards, facing each other, are parallel to each other, wherein the eleventh included angle points to the first control circuit board, the eighth included angle points to the second control circuit board, the ninth included angle points to the third control circuit board, and the tenth included angle points to the fourth control circuit board, a connecting line of the eleventh included angle and ninth included angle is perpendicular to the first control circuit board and the third control circuit board respectively, and a connecting line of the eighth included angle and the tenth included angle is perpendicular to the second control circuit board and the fourth control circuit board; and
   a sphere enabling the first control circuit board to be electrically conducting when the sphere is in the ninth included angle and contacts with an internal side of the ninth circuit board and an internal side of the tenth circuit board, enabling the second control circuit board to be electrically conducting when the sphere is in the tenth included angle and contacts with an internal side of the eleventh circuit board and an internal side of the tenth circuit board, enabling the third control circuit board to be electrically conducting when the sphere is in the eleventh included angle and contacts with an internal side of the eleventh circuit board and an internal side of the eighth circuit board, and enabling the fourth control circuit board to be electrically conducting when the sphere is in the eighth included angle and contacts with an internal side of the eighth circuit board and an internal side of the ninth circuit board.

7. The circuit board sensing module according to claim 6, wherein each of the eighth circuit board, the ninth circuit board, the tenth circuit board, and eleventh circuit board further comprise at least two sensing devices.

8. The circuit board sensing module according to claim 1, wherein the circuit board sensing module further comprises:
   five circuit boards comprising a twelfth circuit board, a thirteenth circuit board, a fourteenth circuit board, a fifteenth circuit board, and a sixteenth circuit board to form a hollow pentahedron, wherein the twelfth circuit board and the thirteenth circuit board form a twelfth included angle, the thirteen circuit board and the fourteenth circuit board form a thirteenth included angle, the fourteenth circuit board and the fifteenth circuit board form a fourteenth included angle, the fifteenth circuit board and the sixteenth circuit board form a fifteenth included angle, and sixteenth circuit board and the twelfth circuit board form a sixteenth included angle;
   five control circuit boards comprising a fifth control circuit board, a sixth control circuit board, a seventh control circuit board, an eighth control circuit board, and a ninth control circuit board, and encompassing external sides of the five circuit boards to form a hollow pentahedron; and
   a sphere enabling the fifth control circuit board to be electrically conducting when the sphere is in the twelfth included angle and contacts with an internal side of the twelfth circuit board and the thirteenth circuit board, enabling the sixth control circuit board to be electrically conducting when the sphere is in the thirteenth included angle and contacts with an internal side of the thirteenth circuit board and the fourteenth circuit board, enabling the seventh control circuit board to be electrically conducting when the sphere is in the fourteenth included angle and contacts with an internal side of the fourteenth circuit board and the fifteenth circuit board, enabling the eighth control circuit board to be electrically conducting when the sphere is in the fifteenth included angle and contacts with an internal side of the fifteenth circuit board and the sixteenth circuit board, and enabling the ninth control circuit board to be electrically conducting when the sphere is in the sixteenth included angle and contacts with an internal side of the sixteenth circuit board and the twelfth circuit board.

9. The circuit board sensing module according to claim 8, wherein each of the twelfth circuit board, the thirteenth circuit board, the fourteenth circuit board, the fifteenth circuit board, and the sixteenth circuit board comprises at least two sensing devices.

10. The circuit board sensing module according to claim 1, wherein a plurality of circuit board sensing modules can be connected one by one.

11. A multi-surface operation apparatus comprising:
   a plurality of control interfaces forming a control interface polyhedron, wherein each surface of the control interface polyhedron comprises independent control buttons; and
   a circuit board sensing module located inside the control interface polyhedron, wherein the circuit board sensing module enables a switch of a selected operation interface and shuts down switches of the other operation interfaces when any of the control interfaces is operated, and the circuit board sensing module comprises a plurality of circuit boards forming a hollow circuit board polyhedron, wherein the hollow circuit board polyhedron comprises a plurality of surfaces and a plurality of included angles, and a sphere enabling a selected circuit board of the circuit boards to be electrically conducting and the other circuit boards to be disabled when the sphere is in a selected included angle of the included angles.

12. The multi-surface operation apparatus according to claim 11, wherein the control interface polyhedron can be selected from a remote control interface of electric appliance, telephone dialing interface, video-audio playing interface of multimedia, control interface of electric lock of a house door or car door, touch screen interface, toy game stick, lighting control interface, auto-control interface, graphics operation interface, computer operation interface, mouse control interface, keyboard operation interface, surveillance control interface, temperature sensing interface, pressure sensing and operation interface, tact switch interface, speed sensing interface, balance sensing interface, opto-sensor interface, moisture sensing interface, monitor displaying interface, auto-spin operation interface, window and door operation interface, positioning operation interface, distance-measurement operation interface, voice-control operation interface, monitoring interface, magnetic-control operation interface, power coil operation interface, banner operation interface, and projection operation interface, or a combination thereof.

13. The multi-surface operation apparatus according to claim 11, wherein the multi-surface operation apparatus further comprises a rotatable screen and the rotatable screen can be rotated toward right and left 120 degrees respectively, wherein the rotatable screen can be controlled by the circuit board sensing module.

\* \* \* \* \*